United States Patent [19]

Dunn et al.

[11] Patent Number: 4,774,457
[45] Date of Patent: Sep. 27, 1988

[54] ELECTRIC POWER MEASURING DEVICES

[75] Inventors: Trevor R. Dunn, Harrow; David R. S. Lucas, Wembley; Ben B. North, London; Timothy R. Joyce, Stone, all of England

[73] Assignee: The General Electric Company, p.l.c., England

[21] Appl. No.: 608,481

[22] Filed: Oct. 14, 1987

[30] Foreign Application Priority Data

Oct. 17, 1986 [GB] United Kingdom ............... 8624926

[51] Int. Cl.$^4$ ................. G01R 21/06; G01R 11/16
[52] U.S. Cl. ................................... 324/142; 324/130; 364/483; 364/571.01
[58] Field of Search ............... 324/142, 141, 107, 111, 324/130, 132, 105; 364/483, 571, 573

[56] References Cited

U.S. PATENT DOCUMENTS

| 3,875,508 | 4/1975 | Milkovic | 324/142 |
|---|---|---|---|
| 4,315,212 | 2/1982 | Gamoh | 324/142 |
| 4,359,684 | 11/1982 | Ley | 324/142 |
| 4,485,343 | 11/1984 | Milkovic | 324/142 |
| 4,495,463 | 1/1985 | Milkovic | 324/142 |
| 4,500,973 | 2/1985 | Ley | 364/606 |
| 4,514,686 | 4/1985 | Mayfield | 324/142 |
| 4,535,287 | 8/1985 | Milkovic | 324/142 |
| 4,733,171 | 3/1988 | Milkovic | 324/142 |

FOREIGN PATENT DOCUMENTS 2076975 12/1981 United Kingdom .

Primary Examiner—Ernest F. Karlsen
Attorney, Agent, or Firm—Kirschstein, Kirschstein, Ottinger & Israel

[57] ABSTRACT

An electric power measuring device wherein input analogue signals representative of instantaneous values of current and voltage are applied to a multiplier (23) and the resulting product signal is applied to a converter (35, 37, 41, 43, 45, 47) to provide a pulse output signal having a pulse rate representative of the product, and hence of the level of power consumption. The converter is of the kind including a capacitor (35) which is charged during successive periods of equal duration by the product signal and a much larger reference signal which reverses at the end of each capacitor charging period until the capacitor charge does not reverse in polarity during a charging period, so that reversal of charge on the capacitor is assured during the next charging period, whereafter the direction of the reference signal is again reversed at the end of each charging period. The reference signal is constituted by a bias signal component in the output of the multiplier to avoid errors in the converter output pulse rate due to spurious variations in the output of the multiplier.

7 Claims, 2 Drawing Sheets

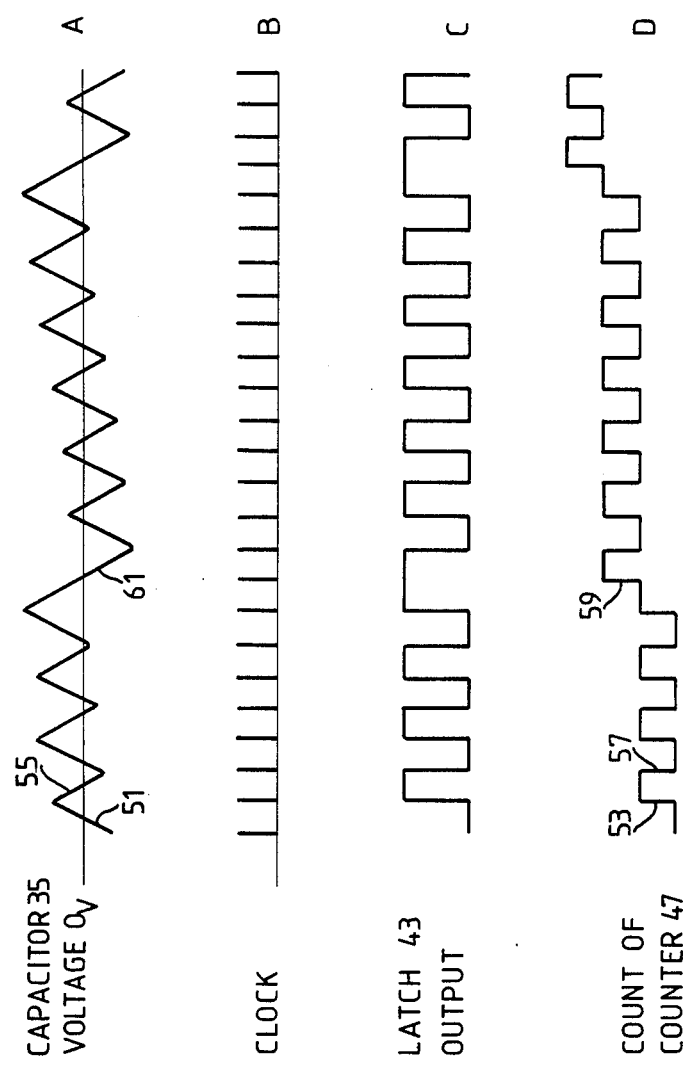

ELECTRIC POWER MEASURING DEVICES

This invention relates to electrical power measuring devices.

More particularly the invention relates to such devices of the kind comprising: input means for producing first and second analogue signals respectively representative of the instantaneous. values of a voltage and current supplied to a load; multiplier means for producing in response to said first and second signals a third analogue signal representative of the product of said first and second signals; and converter means for producing in response to said third signal an output pulse signal having a pulse rate representative of the product of said voltage and current. Such a device is hereinafter referred to as a device of the kind specified.

It will be appreciated that by totalling the output pulses of such a device a measure of the energy consumed in the load may be obtained.

A feature of the design of known devices of the kind specified is the application of bias signals to the inputs of the multiplier means so that the multiplier means operates with signals of appreciable value irrespective of the values of said first and second signals i.e. the values of the voltage and current supplied to the load. As a consequence the output signal of the multiplier means also includes a bias signal component.

A known form of converter means suitable for use in a device of the kind specified includes a capacitor which during successive charging periods of equal duration is charged by an input signal and by a much larger reference signal, the direction of which reference signal reverses at the end of each period until the charge on the capacitor does not reverse polarity during a charging period. The direction of the reference signal is then not reversed for the next charging period to ensure a reversal of the polarity of the capacitor charge during that next period, whereafter the direction of the reference signal is again reversed at the end of each charging period. The frequency of the occurrence of two successive charging periods in which the reference signal is of the same direction is then representative of the magnitude of the input signal.

Such a converter means is hereinafter referred to as a converter means of the kind specified.

One problem which arises when a converter means of the kind specified is used in a device of the kind specified is that the converter means input signal, i.e. the third analogue signal, is likely to be subject to variations due to manufacturing variations in the parameters of the circuits producing the third analogue signal, and variations due to ambient temperature variations in use, with consequent errors in the output pulse rate of the converter means.

It is an object of the present invention to overcome this problem.

According to the present invention in a device of the kind specified wherein said converter means is of the kind specified, said reference signal of the converter means is arranged to be effectively constituted by a bias signal component included in the output of said multiplier means in addition to said third analogue signal.

Another feature of the design of known devices of the kind specified is the provision of means to ensure that no output pulse signal is produced when either one of said first and second signals is zero. It will be appreciated that this requirement is equivalent to the requirement that the disc of a Ferraris electricity meter should not creep round whilst the current input to the meter is zero.

In a device according to the present invention this function is suitably achieved by providing inhibit means for inhibiting the output of said device unless the converter means output pulse rate exceeds a value corresponding to a predetermined value of the product of said first and second signals. Said inhibit means suitable comprises means for inhibiting the production of a pulse at the output of said device if the time which has elapsed since the last pulse at the output of the converter means is more than a predetermined value.

One electrical power measuring device in accordance with the invention will now be described, by way of example, with reference to the accompanying drawings in which:

FIG. 2 illustrates the operation of a current to frequency converter incorporated in the device of FIG. 1.

Figure 1:
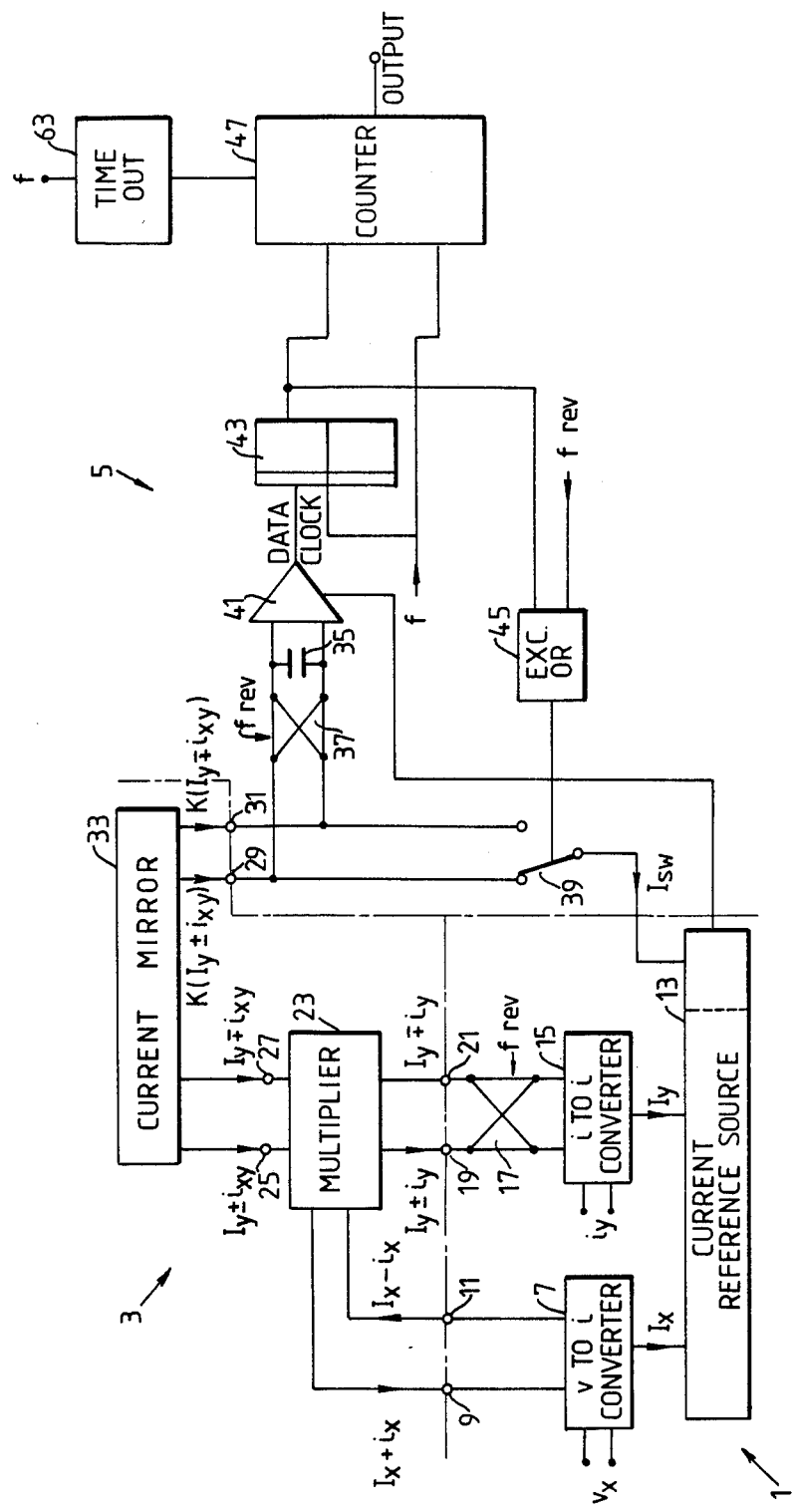
FIG. 1 is a block schematic diagram of the whole device.

Referring to FIG. 1, the device comprises three basic sections 1, 3 and 5.

The first section 1 includes a voltage to current converter 7 which, in response to an input voltage $v_x$ representative of the instantaneous value of the current supplied to a load, produces a pair of signals at terminals 9 and 11 respectively of the form $I_x+i_x$ and $I_x-i_x$, where $i_x$ is a current which is representative of the input voltage $v_x$ and $I_x$ is a bias current derived from a source 13 having a value significantly greater than the maximum expected value of $i_x$.

The first section further includes a current converter 15 which, in response to an input current $i_y$ representative of the instantaneous value of the voltage at which the load is supplied with current, a pair of signals of the form $I_y+i_y$ and $I_y-i_y$, where $I_y$ is a bias current derived from the source 13.

The first section further includes a reversing switch 17 operated at a frequency f rev whereby the signals $I_y+i_y$ and $I_yi_y$ are supplied either to a pair of terminals 19 and 21 respectively, or respectively to the terminals 21 and 19.

The second section of the device includes a Gilbert cell transconductance multiplier 23 having the currents at terminals 9, 11, 19 and 21 as inputs so as to produce at terminals 25 and 27 output currents $I_y \pm i_{xy}$ and $I_y \pm i_{xy}$ respectively where $i_{xy}$ is the product of current $i_x$ and $i_y$, the upper or lower signs occurring in dependence on the condition of the reversing switch 17.

The currents at terminals 25 and 27 are mirrored at a pair of terminals 29 and 31 by a current mirroring circuit arrangement 33. The currents at terminals 29 and 31 are therefore $K(I_y \pm i_{xy})$ and $K(I_y \mp i_{xy})$ where K is approximately unity but varies with the manufacturing parameters of the relevant circuits and thereafter with ambient temperature.

The third section of the device comprises a current to frequency converter utilising the Delta-Sigma technique to produce an output pulse train in which the pulse rate is proportional to the current $i_{xy}$.

The converter includes an integrating capacitor 35 which is connected across the terminals 29 and 31 via a reversing switch 37 operated in synchronism with the reversing switch 17. A reference current $I_{sw}$ derived from the source 13 is selectively applied to the terminal 29 or 31 via a switch 39. The value of the reference current $I_{sw}$ is controlled so as to have a value equal to the sum of the currents at terminals 29 and 31.

The charge on the capacitor 35 is monitored by a comparator 41, the comparator 41 producing a digital output indicating the polarity of the charge on the capacitor 35. The comparator output constitutes a data input to a latch 43 which has a clock input at a frequency f. The condition of the latch 43 determines the condition of the switch 39 via an exclusive —OR gate 45. The switch 39 is also operated in synchronism with the reversing switches 17 and 37 by application of a signal f rev to a second input of the exclusive —OR circuit 45. The converter further includes a reversible counter 47 which counts in response to an input at the clock frequency f in a direction determined by the output of the latch 43.

The operation of the current to frequency converter will now be explained with reference to FIG. 2, ignoring at first the existance of the reversing switches 17 and 37, and the f rev input to the exclusive —OR gate 45.

Referring to FIG. 2, with the switch 39 in the position shown in FIG. 1, and the reference current $I_{sw}$ set at a value $2KI_y$, the capacitor 35 is effectively charged by the current from terminal 31 only, (i.e. the difference between $I_{sw}$ and the current from terminal 29), say $K(I_y+i_{xy})$, the capacitor voltage thus ramping in, say, an upward direction as indicated at 51 in FIG. 2A.

When the next clock pulse occurs this is counted by the counter 47 in a direction set by the output condition of latch 43, say in the up direction, as shown at 53 in FIG. 2D. In addition, if the comparator 41 monitors a positive charge on capacitor 35, the comparator 41 will apply 'true' data to the latch 43, and the clock pulse will transfer this 'true' data to the output of the latch. As a result, the counter 47 is set to count in the down direction and the position of the switch 39 is changed via gate 45.

The capacitor 35 is now charged in the reverse direction by the current $K(I_y-i_{xy})$ from terminal 29 (i.e. the capacitor is charged by a current $K(-I_y+i_{xy})$) so that the capacitor voltage ramps downwards as shown at 55 in FIG. 2A. At the next clock pulse the counter 47 counts one in the down direction as indicated at 57 in FIG. 2D, and the comparator 41 monitors a negative charge on the capacitor 35. The comparator will therefore apply 'false' data to the latch 43, and the clock pulse will transfer this 'false' data to the output of the latch, thus changing the position of switch 39 via gate 45 and resetting the counter 47 to count in the up direction. The converter is thus returned to its original state except that the capacitor 35 has a charge greater than its original charge by the integral of $K(i_{xy})$ over two clock periods.

The above described procedure then repeats until the accumulated value of the charge due to $K(i_{xy})$ on capacitor 35 is such that when the latch 43 is clocked the comparator 41 does not monitor a change in the polarity of the charge on capacitor 35 and latch 43 does not change its state. As a result the counter 47 counts in the up direction for a second time, as indicated at 59 in FIG. 2, and the switch 39 does not change its position. As a result the capacitor voltage ramps down for a second clock period, as indicated at 61 in FIG. 2A, thus ensuring that the above described procedure starts again at the next clock pulse.

The counter 47 is arranged to provide an output pulse each time its count reaches a predetermined value, whereupon the counter is reset to a second, lower, predetermined value.

The rate of advance of the counter, and hence the pulse rate of the output of the counter may be deduced as follows:

Take the charge on capacitor 35 at time t to be $Q_1$. Considering N+M clock periods each $\Delta t$ long for N of which the switch 39 is in the position shown in FIG. 1 so that the capacitor charging current ic is $K(I_y+i_{xy})$ and for M of which the switch 39 is in its other position so that the capacitor charging current $i_c$ is $K(-(I_y-i_{xy}))=K(-I_y+i_{xy})$. The charge $Q_2$ on the capacitor 35 at the end of the N+M clock periods is given by the expression $$Q_2 = Q_1 + \int_{t=0}^{t=(N+M)\Delta t} i_c \, dt$$

The accumulated increase $\Delta Q$ of charge on the capacitor is therefore $$\int_{t=0}^{t=(N+M)\Delta t} Ki_{xy}dt + \sum_{0}^{N} KI_y t + \sum_{0}^{M} K(-I_y)\Delta t$$

$$= K \int_{0}^{t(N+M)\Delta t} i_{xy} \, dt + K(N-M) I_y \Delta t$$

Since, in the long term, the value of Q is negligible the advance of the counter M−N is given by $$\int i_{xy} \, dt / I_y \Delta t$$

Hence the counter 47 provides an output pulse signal at a rate determined by $$f . i_{xy}/I_y$$

It can be seen that by using as a reference current in the current to frequency converter a current $KI_y$ which is the same as the output from the mirroring circuit 33 when its input is $I_y$, i.e. the bias current component of the output of the mirroring circuit, the constant of proportionality K of the output of the multiplier and the mirroring circuit arrangement 23, 33 has no effect on the calibration of the device. Thus, since both measured and reference terms pass through the mirroring arrangement, any scaling changes caused by the mirroring arrangement apply equally to each. In order that this be the case, the reference current $I_{sw}$ is controlled by a signal derived from the comparator 41 so as to have a value equal to the sum of the currents at the terminals 29 and 31, i.e. a value equal to twice the value of the bias current component $KI_y$ in the currents at terminals 29 and 31.

The operation of the reversing switches 17 and 37 will now be considered.

The operation of the switches 17 and 37 together effects cancellation of any offsets occurring in the $i_{xy}$ component of the output of the multiplier 23. This is achieved as follows. If, for example, the offset effectively causes an increase in the value of the $i_{xy}$ component when the reversing switch 17 is in one position, the offset will cause a corresponding decrease in $i_{xy}$ when the reversing switch 17 is in its other position so that offset error cancels over successive operation of the switch 17. The second reversing switch 37 operates in synchronism with the switch 17 to cancel the reversals in the polarity of the output of the multiplier produced by the switch 17.

A similar effect could be achieved if the reversing switch 37 were omitted and the direction of count of the counter 47 reversed in synchronism with operation of the switch 17, as described in U.S. Pat. No. 4,500,973. However, this has the disadvantage that for a given load, each time the reversing switch 17 operates, the polarity with which the capacitor 35 accumulates charge due to $i_{xy}$ reverses. As a result the pulse rate in the output of counter 47 becomes irregular. Such an irregular count has the disadvantage that for low levels of power consumption in the load, a long time is required to check that the average output pulse rate is consistent with the level of power consumption, i.e. it takes a long time to calibrate the device at low levels of power consumption.

It will be appreciated that the period of reversal of the switches 17 and 37 is arranged to be long compared with the clock pulse period.

It will be understood that since the switch 37 reverses the direction of charging of the capacitor 35, a corresponding change in the position of the switch 39 is required each time the switch 37 is reversed. To this end the gate 45 is provided with an input at the frequency f rev. It will also be appreciated that the counter 47 is not required to reverse its counting direction each time the reversing switches 17 and 37 are operated.

It will be understood that whilst the above switching techniques will result in satisfactory operation of the device if the switching operations occur instantaneously at the precise times required, in practice there will be slight imperfections in the timing of the switching operations. The effect of such imperfections on the charging of the capacitor 35 and hence on the rate of counting of the counter 47 will vary according to the relative timings of the operation of the reversing switches 17 and 37 and the switch 39. To minimise this problem the times of operation of the switches 17 and 37 are arranged to occur at predetermined times relative to the operation of the switch 39. In particular the time between successive operations of the switches 17 and 37 varies over a two cycle period in the sequence $(n-1) t_f$, $n t_f$, $(n+1) t_f$, $n t_f$ where $t_f$ is the clock cycle period and $n=f/2f$ rev. As a result, with zero power consumed in the load, of each set of four successive operations of the switches 17 and 37, one operation of one sense occurs whilst the capacitor 35 is charging positively, the other operation of that one sense occurs when the capacitor 35 is charging negatively, one operation of the other sense occurs when the capacitor 35 is charging positively, and the other operation of the other sense occurs when the capacitor is charging negatively. This regime also ensures the cancellation of charges injected by the operation of the switches 17 and 37. Any errors produced by switching errors thus tend to cancel out. It will be appreciated that whilst the desired relation between the timings of the operation of the switches 17 and 37 and the switch 39 will increasingly not be achieved as the power consumed in the load increases, the switching errors are then increasingly of less significance.

In order to prevent the occurence of any spurious pulses at the output of the counter 47 when the power consumed in the load is zero, the operation of the counter is inhibited unless the power consumed exceeds a small threshold value.

This is conveniently effected by preventing the propagation of count pulses from an intermediate bit stage of the counter 47 to the next more significant bit stage of the counter 47 if the time which has elapsed since the last count pulse from the intermediate stage exceeds a predetermined value.

Referring to FIG. 1, to this end the counter 47 is associated with a time out circuit 63 which produces a latched time out signal at its output after the receipt of a predetermined number of clock pulses at its input. The time out signal serves to prevent the propagation of count pulses in the counter 47 as described above. The time out circuit 63 is reset on each occurence of such a count pulse. The output of the counter 47 is thus inhibited if the time between successive count pulses at the output of the intermediate bit counter stage is greater than the time taken for the predetermined number of clock pulses to occur.

It will be appreciated that a device in accordance with the invention, since it operates in response to instantaneous value of voltage and current may be used to measure power both in direct current circuits and alternating current circuits, and in the latter case takes account of power factor. In a device for use in a 50 Hz alternating current circuit, the value of f is typically 8000 per second and the value of f rev 256 per second.

We claim:

1. An electric power measuring device comprising: input means for producing first and second analogue signals respectively representative of the instantaneous values of a voltage and current supplied to a load; multiplier means for producing in response to said first and second signals a third analogue signal representative of the product of said first and second signals; and converter means for producing in response to said third signal an output pulse signal having a pulse rate representative of the product of said voltage and current; wherein said converter means comprises a capacitor and means whereby said capacitor is charged during successive charging periods of equal duration by a signal representative of said third analogue signal and by a larger reference signal, the direction of which reference signal reverses at the end of each period until the charge on the capacitor does not reverse polarity during a charging period, the direction of the reference signal being then not reversed for the next charging period to ensure a reversal of the polarity of the capacitor charge during that next period, whereafter the direction of the reference signal is again reversed at the end of each charging period; and wherein said reference signal of the converter means is effectively constituted by a bias signal component included in the output of said multiplier means in addition to said third analogue signal.

2. A device according to claim 1 wherein said multiplier means produces two output signals respectively of the form $K(I_y+i_{xy})$ and $K(I_y-i_{xy})$ where $KI_y$ is said bias signal component $Ki_{xy}$ is said third analogue signal and K is a variable factor, and said converter means includes means whereby said capacitor is charged during each charging period by the difference between a signal of value $2KI_y$ and one or other of said multiplier output signals according to required direction of charging of said converter capacitor by said bias signal component.

3. A device according to claim 1 including means for applying bias signals to the inputs of the multiplier means, thereby to produce said bias signal component in the output of said multiplier means.

4. A device according to claim 1 wherein inhibit means are provided for inhibiting the output of said device unless the converter means output pulse rate exceeds a value corresponding to a predetermined value of the product of said first and second signals.

5. A device according to claim 4 wherein said inhibit means comprises means for inhibiting the production of a pulse at the output of said device if the time which has elapsed since the last pulse at the output of the converter means is more than a predetermined value.

6. A device according to claim 5 wherein said converter means includes a multi-stage counter which counts up one for each charging period of one sense and counts down one for each charging period of the other sense and said inhibit means includes means for inhibiting the propagation of count pulses from an intermediate bit stage of the counter to the next more significant bit stage of the counter if the time between successive count pulses at the output of said intermediate bit stage exceeds the time taken for a predetermined number of said charging periods to occur.

7. A device according to claim 1 including means for periodically reversing the polarity of one of said first and second signals and means for effecting corresponding reversals in the device subsequent to the output of the multiplier means.

* * * * *

UNITED STATES PATENT AND TRADEMARK OFFICE
CERTIFICATE OF CORRECTION

PATENT NO. : 4,774,457
DATED : September 27, 1988
INVENTOR(S) : Trevor R. Dunn, et al.

It is certified that error appears in the above-identified patent and that said Letters Patent are hereby corrected as shown below:

Title page:

The serial number is incorrectly printed as "608,481";

please correct same to read as follows:

[21]  Appl. No. 108,481

Signed and Sealed this

Twenty-first Day of March, 1989

Attest:

DONALD J. QUIGG

Attesting Officer

Commissioner of Patents and Trademarks